(12) United States Patent
Ping

(10) Patent No.: US 6,498,063 B1
(45) Date of Patent: *Dec. 24, 2002

(54) EVEN NUCLEATION BETWEEN SILICON AND OXIDE SURFACES FOR THIN SILICON NITRIDE FILM GROWTH

(75) Inventor: Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/975,879

(22) Filed: Oct. 12, 2001

(51) Int. Cl.$^7$ .......................................... H01L 21/8242
(52) U.S. Cl. ...................................... 438/253; 438/396
(58) Field of Search .................................. 438/239, 240, 438/243, 253, 311, 381, 396, 680, 769

(56) References Cited

U.S. PATENT DOCUMENTS

| | | | |
|---|---|---|---|
| 5,445,999 A | * | 8/1995 | Thakur et al. ............... 438/396 |
| 5,952,692 A | | 9/1999 | Nakazato et al. |
| 6,017,791 A | * | 1/2000 | Wang et al. ................. 438/253 |
| 6,046,093 A | | 4/2000 | DeBoer et al. |
| 6,071,771 A | * | 6/2000 | Schuegraf ................... 438/240 |
| 6,143,598 A | | 11/2000 | Martin et al. |
| 6,235,571 B1 | * | 5/2001 | Doan .......................... 438/240 |
| 6,274,899 B1 | | 8/2001 | Melnick et al. |

* cited by examiner

Primary Examiner—David Nelms
Assistant Examiner—David Nhu
(74) Attorney, Agent, or Firm—Killworth, Gottman, Hagan & Schaeff LLP

(57) ABSTRACT

A method of providing even nucleation between silicon and oxide surfaces for growing uniformly thin silicon nitride layers used in semiconductor devices. First, a nonconductive nitride-nucleation enhancing monolayer is formed over a semiconductor assembly having both nitridation receptive and resistive materials. For purposes of the present invention, a nitride-nucleation enhancing monolayer is a material that will readily accept the bonding of nitrogen atoms to the material itself. Next, a silicon nitride layer is formed over the nonconductive nitride-nucleation enhancing monolayer. The nonconductive nitride-nucleation enhancing monolayer provides even nucleation over both the nitridation receptive material and the nitridation resistive material for silicon nitride, thereby allowing for the growth of a uniformly thin nitride layer.

26 Claims, 3 Drawing Sheets

EVEN NUCLEATION BETWEEN SILICON AND OXIDE SURFACES FOR THIN SILICON NITRIDE FILM GROWTH

BACKGROUND OF THE INVENTION

The present invention pertains to semiconductor fabrication processing and more particularly to a method for providing even nucleation between silicon and oxide surfaces for uniformly thin silicon nitride film growth used in semiconductor devices, such as dynamic random access memories (DRAMs).

In the manufacturing of dynamic random access memories (DRAMs), the size of the memory cell is the main contributing factor to the density and overall size of the device. A manufacturer of DRAMs has motivation to increase the storage capability, while maintaining the smallest die size possible, as the smaller die size results in a lower cost per device. As mentioned, the main contributor to the size of a memory device is the amount of space required for each storage cell that makes up the storage array. In that regard, DRAM fabrication engineers have focused on structures, on materials to make the structures and on methods to fabricate the structures necessary to make a storage cell.

To save space, the capacitor of the storage cell must reduce in size and yet maintain adequate capacitance to retain a sufficient charge during DRAM operation. There are several approaches to the capacitor design, for example trench capacitors formed in the substrate of a wafer or a stacked capacitor formed above the wafer substrate, to name two. Regardless of the design chosen, the size of the capacitor must be reduced and yet maintain sufficient capacitance as mentioned previously. Two of the main contributors to capacitance are the surface area of the capacitor plates and the dielectric quality of the insulator separating the capacitor plates. Major engineering efforts have gone into both areas.

In regards to dielectric quality, thin film dielectrics having high dielectric constant characteristics have emerged as the dielectric of choice, as the thinnest film that can be placed between the capacitor plates to prevent dielectric breakdown when a charge is present on the capacitor plates, drastically increases capacitance. With increased capacitance, the overall size of the capacitor can be reduced. However, thin film dielectrics present some challenges in fabricating the complete storage cell structure, which includes a storage cell access transistor and a storage capacitor.

One main challenge and a critical area of concern is oxidation punch through, which is important to avoid when forming thin film dielectrics. Oxidation punch through refers to the mechanism of atomic oxygen diffusing completely through a dielectric film. In the case of a capacitor cell dielectric, if oxidation punch through was allowed to occur a portion of an underlying diffusion region of an access transistor would become oxidized and thus diminish the transistor's operating characteristics. It is critical that oxidation punch through be at least reduced or ideally avoided altogether.

When dealing with thin film dielectrics, the dielectric film needs to be thick enough to sufficiently to reduce oxidation punch through. The minimum thickness of the dielectric film is dependent on the required oxidation time and temperature used and is particularly critical to maintain when using the dielectric film as a capacitor cell dielectric. It is also important that the dielectric film be a uniform film in order to minimize the overall thickness of the film.

One of the thin dielectric films of choice is nitride (i.e., silicon nitride) as nitride possesses sufficient dielectric constant characteristics and can be deposited as a very thin layer (less than 100 Å). However, a nitride film of this thickness is difficult to deposit uniformly on a surface that is made up of different types of material, especially materials that are not receptive to nitride deposition. When trying to deposit thin nitride films on different types of materials, the surface free energy involved in the deposition reaction is different for each of the different types of materials resulting in different incubation times. Because of the different incubation time for each material, uneven nucleation results thereby preventing the formation of a uniform dielectric film, particularly layers less than 100 Å.

Therefore, it is highly desirable to provide a process that solves the uneven nucleation between silicon and oxide surfaces in thin silicon nitride film growth used in semiconductor devices.

SUMMARY OF THE INVENTION

The present invention teaches a method of providing even nucleation between silicon and oxide surfaces for growing uniformly thin silicon nitride layers used in semiconductor devices. First, a nonconductive nitride-nucleation enhancing monolayer is formed over a semiconductor assembly having both nitridation receptive and resistive materials. For purposes of the present invention, a nitride-nucleation enhancing monolayer is a single atomic layer of a material that will readily accept the bonding of nitrogen atoms to the material itself. Next, a silicon nitride layer is formed over the nonconductive nitride-nucleation enhancing monolayer. The nonconductive nitride-nucleation enhancing monolayer provides even nucleation over both the nitridation receptive material and the nitridation resistive material for silicon nitride, thereby allowing for the growth of a uniformly thin nitride layer.

The above method can be applied to devices that would benefit from the use of a uniformly thin film layer, such as a memory device (i.e., DRAM, floating gate device, etc.) that operates by storing a charge. For example, one implementation of the present invention is to form a nitride dielectric layer that is less than 100 Å in thickness for the intended use as a storage capacitor dielectric.

These and other features and objects of the present invention will be apparent in light of the description of the invention embodied herein.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiment(s) of the present invention.

DETAILED DESCRIPTION OF THE PREFERRED EMBODIMENTS

Figure 1:
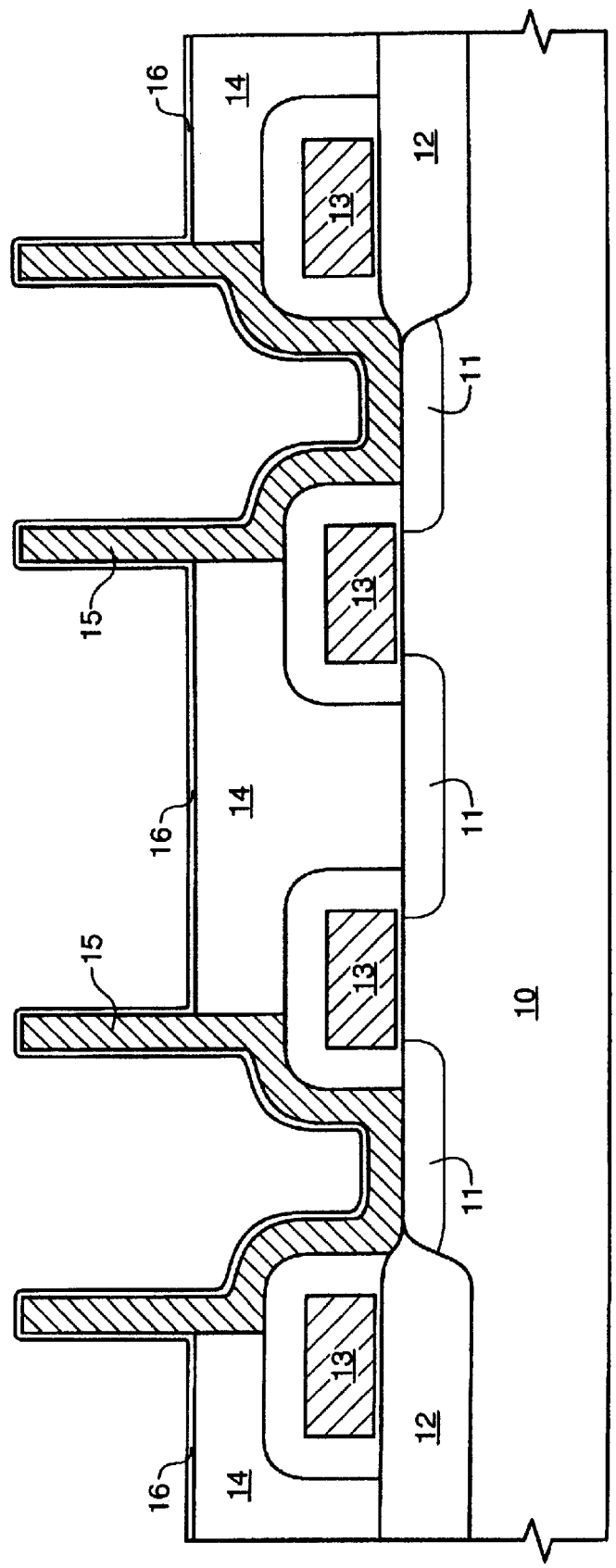
FIG. 1 is a cross-sectional view depicting a semiconductor substrate comprising portions of a memory storage cell having a storage cell access transistor and a bottom electrode for a storage capacitor and a conformal monolayer of silicon dioxide formed thereover.
Figure 2:
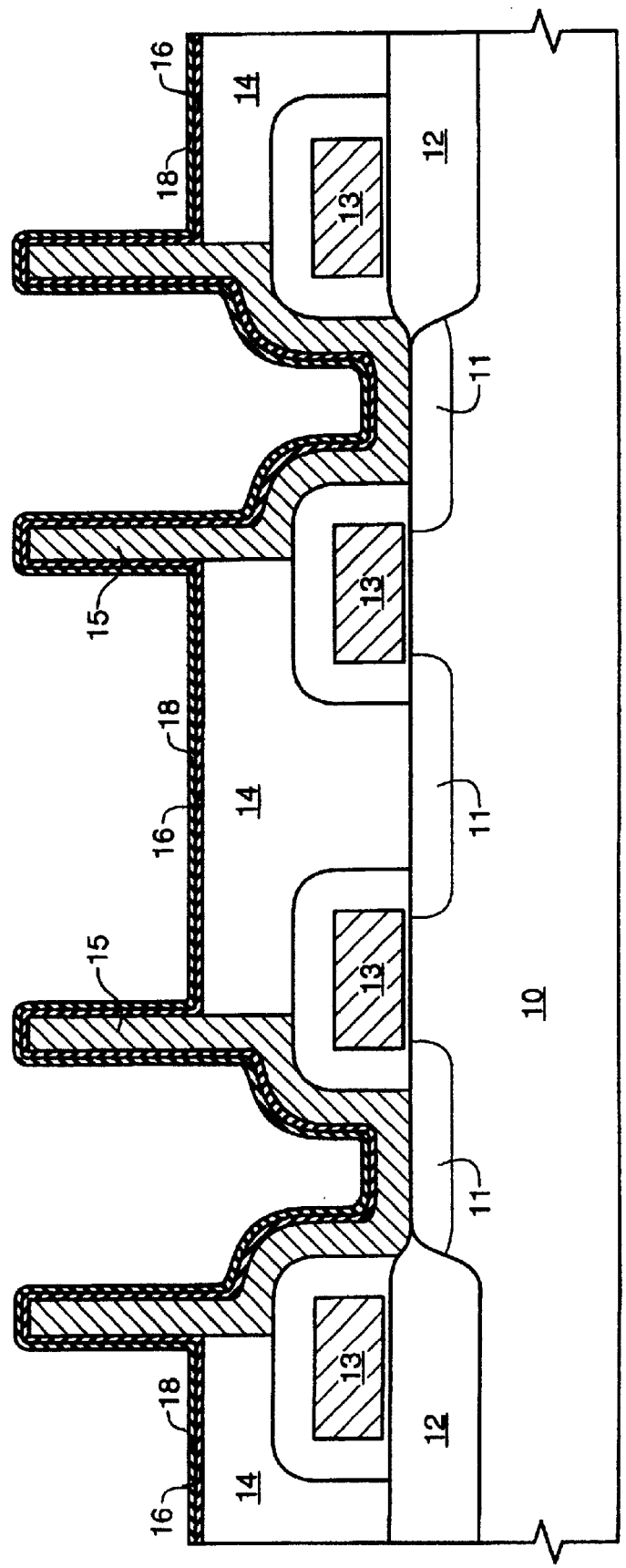
FIG. 2 is a subsequent cross-sectional view taken from FIG. 1 following the formation of a thin dielectric material to a desired thickness, over the silicon dioxide monolayer.
Figure 3:
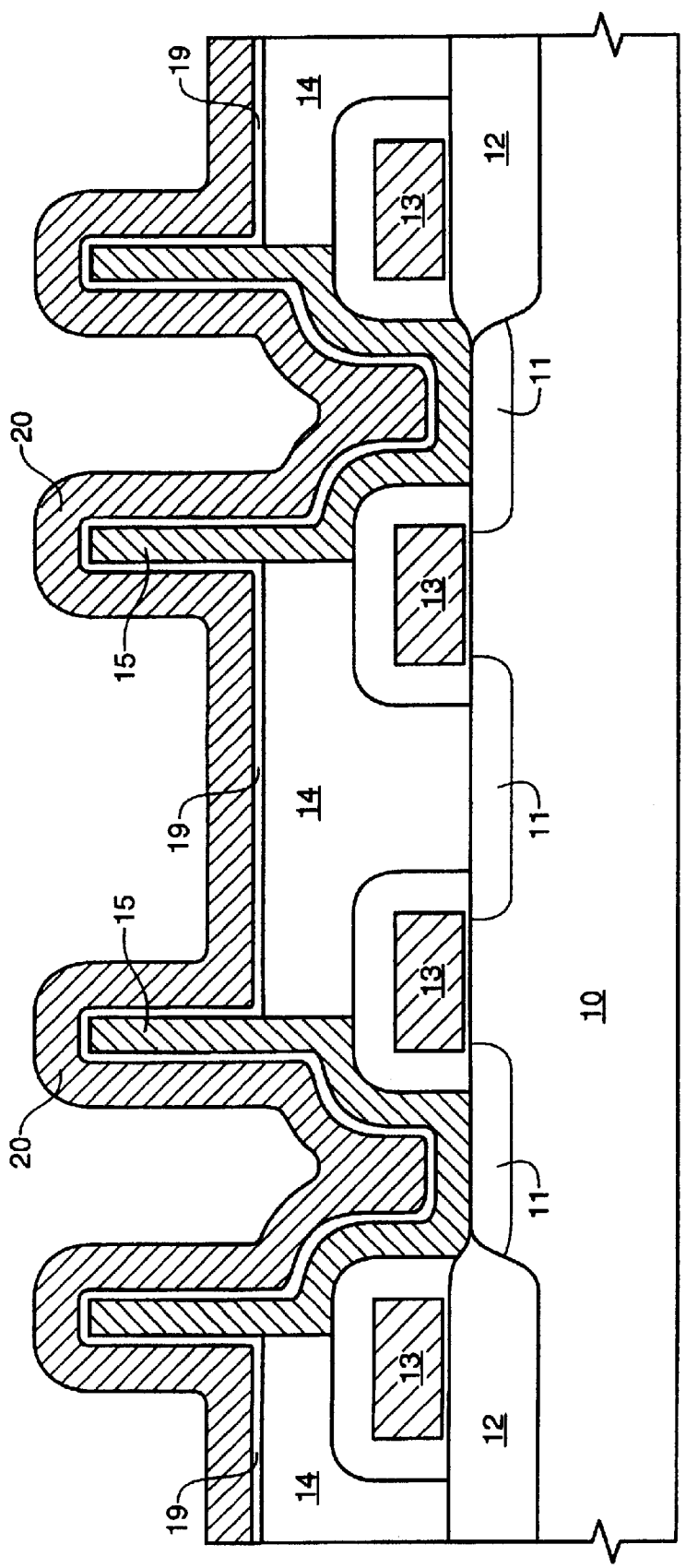
FIG. 3 is a subsequent cross-sectional view taken from FIG. 2 following the formation of a top electrode for the storage capacitor.

An exemplary implementation of the present invention is directed to providing even nucleation between silicon and oxide surfaces to produce a uniformly thin silicon nitride layer used in a semiconductor device as depicted in FIGS. 1–3.

The following exemplary implementation is in reference to the fabrication of dynamic random access memory (DRAM) device. While the concepts of the present invention are conducive to the fabrication of DRAMs, the concepts taught herein may be applied to other semiconductor devices that would likewise benefit from the use of a thin dielectric film that will substantially reduce oxidation punch through. Therefore, the depiction of the present invention in reference to the manufacture of a DRAM (the preferred embodiment), is not meant to limit the extent to which one skilled in the art might apply the concepts taught hereinafter.

The terms "substrate" as used herein include any semiconductor-based or other structure, such as a silicon wafer, having an exposed surface in which to form a structure using the apparatus or method of this invention. Substrate is to be understood as including silicon-on-insulator, doped and undoped semiconductors, epitaxial layers of silicon supported by a base semiconductor foundation, and other semiconductor structures. Furthermore, when reference is made to a substrate in the following description, previous process steps may have been utilized to form active devices, regions or junctions in the base semiconductor structure or foundation.

Referring to FIG. 1, a semiconductive substrate 10 is prepared for the processing steps of the present invention. Transistor gate conductors (word lines) 13 and the transistor diffusion regions 11, separated by field oxide region 12, are formed by conventional DRAM fabrication methods. A layer of planarized insulation material 14 is formed over diffusion regions 11 and word lines 13. In one exemplary implementation, material 14 is a reflowable glass, such as BoroPhosphoSilicate Glass (BPSG). A cavity is patterned and etched into insulation material 14 to form a container cell structure that a conductive material 15. The conductive material may be polysilicon or hemispherical-grained (HSG) silicon to increase the surface area of the storage capacitor. In one embodiment, the conductive material 15 is formed and patterned to produce a bottom plate of a storage capacitor.

Generally, insulating materials such as BPSG, oxides and the like, do not provide atomic bonding surfaces that are receptive to nitridation (the bonding of nitrogen atoms to a given material). For purposes of the present invention these materials are labeled as "nitridation resistive materials." Generally, conductive materials and semiconductive materials, such as metals and silicon, respectively, do provide atomic bonding surfaces that are receptive to nitridation. For purposes of the present invention these materials are labeled as "nitridation receptive materials."

It is at this point that an implementation of an embodiment of the present invention is employed to fabricate a storage cell dielectric. A conformal nonconductive nitride-nucleation enhancing monolayer 16 is formed directly on insulation material 14 and conductive bottom plate 15. The presence of monolayer 16 is critical for the formation of the cell dielectric. The purpose of monolayer 16 is to provide a uniform nucleation surface for a subsequent deposition of silicon nitride, such as used for a cell dielectric material, as monolayer 16 will possess a consistent surface free energy for the subsequent deposition, permitting growth of a uniformly thin silicon nitride layer.

In one embodiment, nucleation monolayer 16 is deposited by atomic layer deposition (ALD), which is a technique for the deposition of thin films that is related to chemical vapor deposition. In a chemical vapor deposition system, one or more reactants that are capable of reacting to form a solid thin film are presented to a solid surface where the surface catalyzes the reaction. Most often, the surface enhancement is effected by heating the substrate to be coated. If the gas phase reactants are not very reactive, then a high substrate temperature is needed to achieve any reasonable deposition rate. If reactants that are more reactive are chosen, then reactions may occur in the gas phase, before the substrate is reached, and the film quality may suffer. An alternative to hotter substrates is to establish a glow discharge in the reactants. This discharge creates a very reactive mixture of free radicals, and lower substrate temperatures are feasible. However, gas phase reactions are again enhanced, and the film quality may suffer.

ALD deals with these difficulties by separating the individual reactants, and by taking advantage of the phenomenon of surface adsorption. When a substrate is exposed to a gas, it becomes coated with a layer of the gas. Then by removing the gas, for example by pumping the chamber out with a vacuum pump, under certain circumstances a monolayer of the gas remains on the substrate surface. At moderate temperatures (i.e., room temperature), the monolayer is held weakly by physical adsorption forces. At higher temperatures, a surface chemical reaction occurs which holds the monolayer strongly by chemisorption forces. Then, when the second reactant is introduced to the chamber, it reacts with the adsorbed layer to form a layer of solid film, allowing thin solid films to be grown a layer at a time. These thin solid films can be amorphous, polycrystalline or epitaxial, depending on the specific process.

ALD offers many advantages for thin solid film growth, such as uniform film-thickness over large wafers (i.e., 300 mm) can be deposited, and these films will be conformal. In addition, thickness control can be readily achieved simply by counting the number of cycles, and it is possible to obtain perfect surface coverage with no pinholes. Finally, because of the nature of the process, it can be carried out in a simplified reactor, where gas flow and temperature uniformity will be relatively unimportant.

In the illustrative embodiment of FIG. 1, silicon tetrachloride is reacted with moisture to deposit an atomic layer of silicon dioxide on the surfaces of the insulation material 14 and bottom plate 15. The chemical reaction is self-limiting since only forming one monolayer and produces hydrochloric acid as a residual by-product. In this example, the atomic layer deposition is carried out with a temperature between about 400° C. to about 550° C., for about 40 minutes to about 50 minutes. By this method, nucleation monolayer 16 is a uniformly thick, single atomic layer, which for silicon dioxide this thickness is approximately 2 Å.

Referring now to FIG. 2, after deposition of the oxide monolayer and evacuation of the residual by-product and moisture, a uniformly thin silicon nitride film 18 is then added consequently by conventional CVD to monolayer 16 of FIG. 1. In one embodiment, silicon nitride deposition is carried out by introducing a nitrogen containing gas and a silicon containing gas to a fabrication chamber (not shown) that is maintained at temperatures from about 600° C. to about 700° C., for about 35 minutes to about 45 minutes. The nitride film 18 is deposited to a thickness such that when combined with nucleation monolayer 16 the total thickness is approximately less than 100 Å (50 Å or less is preferred). The nucleation monolayer 16 provides a consistent nucleation surface for the deposition of nitride layer 18, thus resulting in a nitride film of uniform thickness overlying material 14 (a nitridation resistive material) and bottom electrode 15 (a nitridation receptive material). Nitride layer 18 can be formed insitu after the formation of the silicon dioxide layer by simply presenting a nitrogen source gas (such as $NH_3$) to the deposition chamber using deposition conditions suitable for both silicon dioxide and nitride deposition.

Referring now to FIG. 3, nucleation monolayer 16 (FIG. 1) combined with deposited silicon nitride layer 18 (FIG. 2) are now represented as cell nitride dielectric layer 19. With a consistent, uniform thickness less than 100 Å (50 Å or less is preferred), cell nitride dielectric layer 19 now possesses a thickness that is sufficient to prevent oxidation punch through from a subsequent wet oxidation step needed to fill any pinholes in layer 19. Oxidation punch through refers to the mechanism of atomic oxygen diffusing completely through a dielectric film and diffusing all the way to an implanted region. In this example, if punch through were allowed, oxygen atoms would possibly reach implanted regions 11, which would result in oxidation of the implanted source/drain regions 11.

Typically, a nitride film used as a cell dielectric is subjected to an oxidation ambient provided in the fabrication chamber (not shown), at a moderate temperature (700–900° C.) and for a prolonged period of time (i.e., greater than 40 minutes). If oxygen atoms reach an implanted diffusion region, the region will oxidize which means the oxidation process will consume some of the silicon in the implanted diffusion region and thus adversely affect transistor operation. Using the methods of the present invention the oxidation of cell dielectric layer 19 would limit punch through and thus greatly limit the oxidation of the implanted diffusion regions 11.

Continuing with FIG. 3, a top storage capacitor electrode is fabricated by the formation of a conductive layer 20 to complete storage capacitor formation. From this point on the device is completed as dictated by the fabrication process used by those skilled in the art.

Though an exemplary implementation of the present invention described above teaches the use of silicon nitride in a storage capacitor, the method would also apply to other dielectric films, such as $TaO_5$, and other devices, such as a floating gate device and/or an ONO stack. Using $TaO_5$, for example, would require forming a monolayer of tantalum for monolayer 16, converting it to $TaO_5$, and depositing a layer of $TaO_5$ (layer 18) to a desired thickness. Additionally, although ALD is preferred, other processes capable of depositing/producing a monolayer may be used.

An advantage of methodology of the present invention is that the same surface condition is obtained by the monolayer oxide to provide the best nucleation for silicon nitride growth. Another advantage is that the monolayer further minimizes the reduction on the effective dielectric constant seen between the layers of silicon nitride and silicon dioxide, thereby maintaining high cell capacitance. Finally, all the steps can be finished in one run thereby minimizing production overhead.

In the foregoing specification, the invention has been described with reference to specific embodiments. However, one or ordinary skill in the art appreciates that various modifications and changes can be made without departing from the skill of the present invention as set forth in the claims below. Accordingly, the specification and figures are to be regarded in an illustrative rather than a restrictive sense, and all such modifications are intended to be included within the scope of the present invention. What is claimed is:

What is claimed is:

1. A method for providing even nucleation between silicon and oxide surfaces for uniform silicon nitride film growth used in a semiconductor assembly, said method comprising the step of:

forming a nonconductive nitride-nucleation enhancing monolayer directly on a nitridation receptive material and a nitridation resistive material, whereby said nonconductive nitride-nucleation enhancing monolayer provides for the uniform silicon nitride film growth over said nitridation receptive material and said nitridation resistive material.

2. The method as recited in claim 1, wherein said nonconductive nitride-nucleation enhancing monolayer is a single atomic layer of silicon dioxide.

3. The method as recited in claim 1, further comprising forming a silicon nitride layer directly on said nonconductive nitride-nucleation enhancing monolayer.

4. The method as recited in claim 3, wherein said forming a nonconductive nitride-nucleation enhancing layer and forming a silicon nitride layer comprise depositing said layers to a combined thickness less than 100 Å.

5. A method for forming a uniform dielectric film in a semiconductor assembly, said method comprising the steps of:

forming a nonconductive nucleation enhancing monolayer directly on a dielectric receptive material and a dielectric resistive material; and, forming a dielectric layer directly on said nonconductive nucleation enhancing monolayer, whereby said nonconductive nucleation enhancing monolayer provides for said dielectric layer to have a uniform thickness over said dielectric receptive material and said dielectric resistive material.

6. The method as recited in claim 5, wherein said nonconductive nucleation enhancing monolayer is a single atomic layer of silicon dioxide.

7. The method as recited in claim 5, wherein said dielectric layer comprises silicon nitride.

8. The method as recited in claim 5, wherein said forming a nonconductive nucleation enhancing monolayer and forming a dielectric layer comprise depositing said layers to a combined thickness less than 100 Å.

9. The method as recited in claim 5, wherein both said forming a nonconductive nucleation enhancing monolayer and forming a dielectric layer are performed insitu.

10. A method for forming a uniform dielectric film in a semiconductor assembly, said method comprising the steps of:

forming a silicon dioxide monolayer directly on a nitridation receptive material and a nitridation resistive material; and, forming a silicon nitride layer directly on said silicon dioxide monolayer, whereby said silicon dioxide monolayer provides for said silicon nitride layer to have a uniform thickness over said nitridation receptive material and said nitridation resistive material.

11. The method as recited in claim 10, further comprising exposing said silicon nitride layer to an oxidation ambient.

12. The method as recited in claim 10, wherein said depositing a silicon nitride layer comprises depositing said silicon nitride layer to a thickness such that the combined thickness of said silicon nitride and said silicon dioxide monolayer is 50 Å or less.

13. The method as recited in claim 10, wherein said forming a silicon dioxide monolayer and said forming a silicon nitride layer are performed insitu.

14. A method for forming a uniform dielectric film for a memory device, said method comprising steps of:
   forming a silicon dioxide monolayer directly on a capacitor storage electrode and directly on an nitridation resistive material; and
   forming a silicon nitride layer directly on said silicon dioxide monolayer whereby, said silicon dioxide monolayer provides for said silicon nitride layer to have a uniform thickness over said capacitor storage electrode and said nitridation resistive material.

15. The method as recited in claim 14, further comprising exposing said silicon nitride layer to an oxidation ambient.

16. The method as recited in claim 14, wherein said depositing a silicon nitride layer comprises depositing said silicon nitride layer to a thickness such that the combined thickness of said silicon nitride and said silicon dioxide monolayer is 50 Å or less.

17. A method for forming a uniform dielectric film in a semiconductor fabrication process, said method comprising the steps of:
   forming a monolayer having a consistent surface free energy to a chemical reaction directly on a nitridation receptive material and a nitridation resistive material through chemisorption; and,
   depositing a dielectric compound directly on said monolayer while using the surface of said monolayer as a nucleation surface to form a uniformly thick dielectric layer.

18. The method as recited in claim 17, wherein said semiconductor fabrication process comprises a floating gate fabrication process used to fabricate the floating gate dielectric.

19. The method as recited in claim 17, wherein said forming a monolayer comprises depositing a single atomic layer of silicon dioxide.

20. The method as recited in claim 19, wherein said single atomic layer of silicon dioxide is deposited by reacting silicon tetrachloride with moisture.

21. The method as recited in claim 20, wherein said atomic layer deposition is carried out with a temperature between about 400° C. to about 550° C., for about 40 minutes to about 50 minutes.

22. The method as recited in claim 20, further comprising evacuating residual by-products and said moisture, and said depositing a dielectric comprises subjecting said monolayer to a thermal nitridation step.

23. The method as recited in claim 22, wherein said dielectric is silicon nitride.

24. The method as recited in claim 22, wherein said thermal nitridation step comprises exposing said monolayer to a nitrogen containing gas and a silicon containing gas, and is carried out with a temperature between about 600° C. to about 700° C., for about 35 minutes to about 45 minutes.

25. The method as recited in claim 17, further comprising exposing said dielectric layer to an oxidation ambient.

26. The method as recited in claim 25, wherein said dielectric layer is subjected to said oxidation ambient at a temperature from about 700° C. to about 900° C., for at least 40 minutes.

* * * * *